United States Patent
Calpito et al.

(10) Patent No.: US 8,048,720 B2
(45) Date of Patent: Nov. 1, 2011

(54) WIRE LOOP AND METHOD OF FORMING THE WIRE LOOP

(75) Inventors: Dodgie Reigh M. Calpito, Portland, OR (US); O Dal Kwon, Singapore (SG)

(73) Assignee: Kulicke and Soffa Industries, Inc., Fort Washington, PA (US)

(*) Notice: Subject to any disclaimer, the term of this patent is extended or adjusted under 35 U.S.C. 154(b) by 158 days.

(21) Appl. No.: 12/375,238

(22) PCT Filed: Jan. 30, 2008

(86) PCT No.: PCT/US2008/052378
§ 371 (c)(1),
(2), (4) Date: Jan. 27, 2009

(87) PCT Pub. No.: WO2009/096950
PCT Pub. Date: Aug. 6, 2009

(65) Prior Publication Data
US 2010/0230809 A1    Sep. 16, 2010

(51) Int. Cl.
*H01L 21/44* (2006.01)
*H01L 21/82* (2006.01)

(52) U.S. Cl. .. 438/123; 438/612; 438/617; 257/E21.509

(58) Field of Classification Search ............ 438/617, 438/123, 612; 228/180.5; 257/E21.509
See application file for complete search history.

(56) References Cited

U.S. PATENT DOCUMENTS

| | | | |
|---|---|---|---|
| 4,230,925 A * | 10/1980 | Lascelles | 219/56.1 |
| 5,945,065 A | 8/1999 | Kikuchi et al. | |
| 6,715,666 B2 | 4/2004 | Imai et al. | |
| 6,815,836 B2 | 11/2004 | Ano | |
| 6,933,608 B2 | 8/2005 | Fujisawa | |
| 7,188,759 B2 | 3/2007 | Calpito et al. | |
| 7,347,352 B2 | 3/2008 | Qin et al. | |
| 2005/0072833 A1 | 4/2005 | Wong et al. | |
| 2005/0189567 A1* | 9/2005 | Fujisawa | 257/200 |
| 2006/0163331 A1 | 7/2006 | Babinetz | |
| 2006/0175383 A1* | 8/2006 | Mii et al. | 228/180.5 |
| 2006/0255101 A1* | 11/2006 | Shirato et al. | 228/180.5 |

FOREIGN PATENT DOCUMENTS

| | | |
|---|---|---|
| JP | 7183303 | 7/1995 |
| JP | 09051011 | 2/1997 |
| KR | 10-2007-0088489 | 8/2007 |

OTHER PUBLICATIONS

International Search Report dated Oct. 24, 2008, for International Application No. PCT/US2008/052378.

* cited by examiner

*Primary Examiner* — Michael Trinh
(74) *Attorney, Agent, or Firm* — Christopher M. Spietzer, Sr.

(57) ABSTRACT

A method of forming a wire loop is provided. The method includes: (1) forming a first fold of wire; (2) bonding the first fold of wire to a first bonding location to form a first bond; (3) extending a length of wire, continuous with the first bond, between (a) the first bond and (b) a second bonding location; and (4) bonding a portion of the wire to the second bonding location to form a second bond.

12 Claims, 20 Drawing Sheets

WIRE LOOP AND METHOD OF FORMING THE WIRE LOOP

CROSS REFERENCE

This application claims the benefit of International Application No. PCT/US2008/052378 filed Jan. 30, 2008, the contents of which is incorporated herein by reference.

FIELD OF THE INVENTION

The present invention relates to the formation of wire loops using a wire bonding machine, and more particularly, to improved methods of forming wire loops.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected. The primary methods of forming wire loops are ball bonding and wedge bonding, with ball bonding being the preferred technique. U.S. Pat. No. 5,945,065 to Kikuchi et al. illustrates conventional ball bonding and wedge bonding processes, as discussed below.

An exemplary conventional wedge bonding sequence is illustrated in FIGS. 2A-2D of U.S. Pat. No. 5,945,065, where the sequence includes: (1) arranging a wire 12 through a lower end of a wedge bonding tool 11, with an electrode 15 of an IC chip 16 below the wedge bonding tool 11; (2) bonding the wire 12 to the electrode 15 through the application of ultrasonic waves to the wedge bonding tool 11, where the wedge bonding tool 11 is pressing the wire 12 against electrode 15; (3) releasing the wire using a clamper 12, and then routing the wire to an outer lead 18, and then lowering the wire 12 to the outer lead 18; (4) bonding the wire 12 to the outer lead 18 through the application of ultrasonic waves; and (5) lifting the clamper 17 while clamping the wire 12 such that the wire 12 is cut. Unfortunately, wedge bonding has certain deficiencies in comparison to ball bonding (e.g., directional issues with the bonding head which result in a slow operation and inaccuracy problems, amongst others). These deficiencies have made ball bonding the preferred wire bonding technique.

Now referring to FIGS. 1A-1D of U.S. Pat. No. 5,945,065, an exemplary conventional ball bonding sequence includes: (1) using electric discharge to form a free air ball 4 on an end of a wire 2 extending from a capillary bonding tool 1; (2) lowering the capillary 1, and pressing the ball 4 to an electrode 5 of an IC chip 6, and applying ultrasonic waves to the ball through the capillary 1 to form a bond between the ball and the electrode 5 (where the IC chip 5 including the electrode 5 is heated by a heater block); (3) routing wire 2 (through motion of capillary 1) toward above outer lead 8, and lowering wire 2 to outer lead 8; (4) bonding the wire 2 to the outer lead 8 through the application of ultrasonic waves; and (5) cutting the wire 2 by closing and raising a damper 7. Of course, in forming the bonds between (a) the ends of the wire loop and (b) the bond site (e.g., a die pad, a lead, etc.) varying types of bonding energy may be used including, for example, ultrasonic energy, thermosonic energy, thermocompressive energy, amongst others. Other examples of ball bonding techniques are disclosed in, for example, U.S. Pat. No. 6,933,608 to Fujisawa; U.S. Pat. No. 6,815,836 to Ano et al.; U.S. Pat. No. 6,715,666 to Imai et al.; U.S. Patent Application Publication No. 2005/0072833 to Wong et al.; and U.S. Patent Application Publication No. 2005/0109819 to Qin et al.

While there are clearly numerous advantages to ball bonding (in comparison to wedge bonding), there are also disadvantages to ball bonding such as, for example: the inclusion of an electronic flame-off assembly (i.e., an EFO assembly) for forming the free air balls; complications to the ball bonding process related to the operation of the EFO assembly; and increased spacing between adjacent bonds because of the formation of the free air balls (in comparison to the wire width requirements in wedge bonding).

Thus, it would be desirable to provide improved methods of wire bonding with certain of the advantages of ball bonding and wedge bonding.

SUMMARY OF THE INVENTION

According to an exemplary embodiment of the present invention, a method of forming a wire loop is provided. The method includes: (1) forming a first fold of wire; (2) bonding the first fold of wire to a first bonding location to form a first bond; (3) extending a length of wire, continuous with the first bond, between (a) the first bond and (b) a second bonding location; and (4) bonding a portion of the wire to the second bonding location to form a second bond.

The methods of the present invention may also be embodied as an apparatus (e.g., as part of the intelligence of a wire bonding machine), or as computer program instructions on a computer readable carrier (e.g., a computer readable carrier used in connection with a wire bonding machine).

According to another exemplary embodiment of the present invention, a wire loop bonded between a first bonding location and a second bonding location is provided. The wire loop includes: (1) a first bond bonded to a first bonding location, the first bond including a first fold of wire bonded directly to the first bonding location; (2) a second bond bonded to a second bonding location; and (3) a length of wire extending between the first bonding location and the second bonding location, the length of wire being continuous with the first bond and the second bond.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

In accordance with certain exemplary embodiments of the present invention, wire bonding techniques are provided whereby free air ball formation may be substantially reduced or even omitted. However, the present invention does not suffer from the direction problems associated with conventional wedge bonding. For example, in certain exemplary embodiments of the present invention, a fold of wire (or multiple folds of wire) is used instead of a free air ball at the first bond site. This fold of wire may be formed at the bonding location, or alternatively, the fold of wire may be formed at another location (i.e., a forming location) and the fold of wire may then be brought to the first bonding location for bonding. These and other aspects of the various exemplary embodiments of the present invention are described in greater detail below.

Figure 1A:
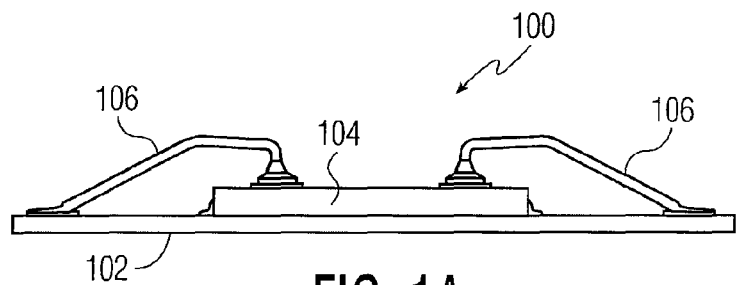
FIG. 1A is a side view of portions of a conventional semiconductor device including wire bonds extending between a semiconductor die and a substrate.
Figure 1B:
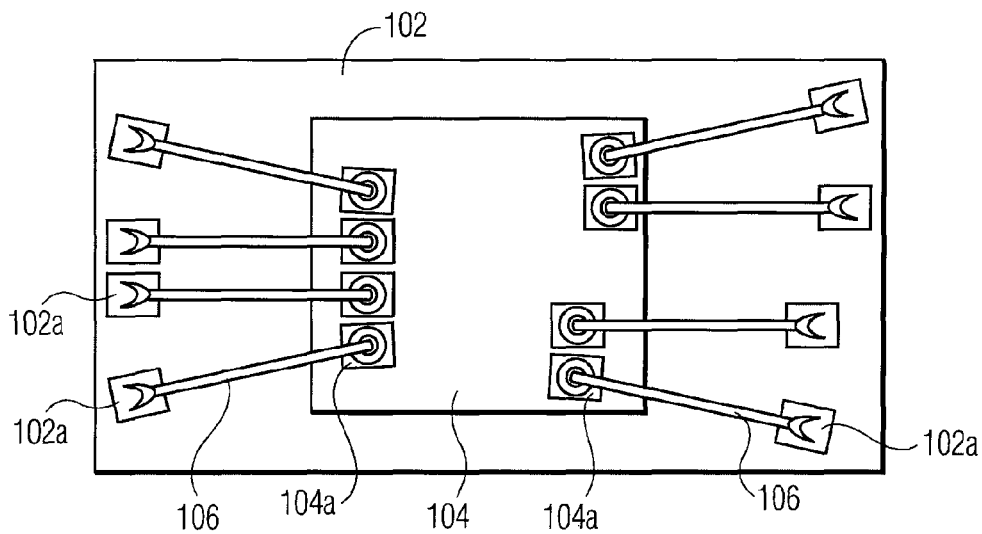
FIG. 1B is a top view of a conventional semiconductor device similar to that shown in FIG. 1A.
Figure 1C:
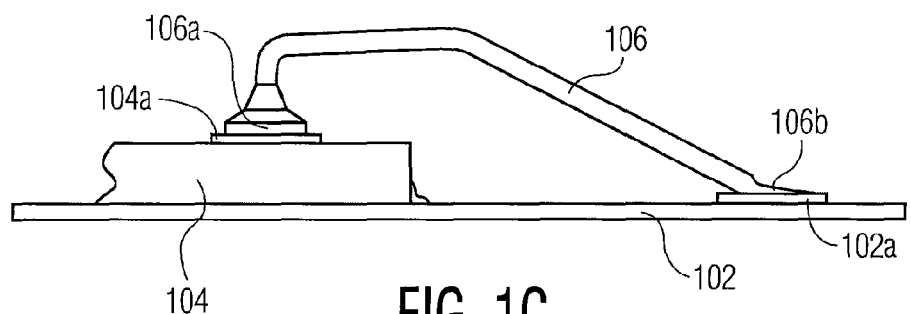
FIG. 1C is a detailed view of a portion of FIG. 1A including a wire loop.

FIG. 1A-1C illustrate semiconductor die 104 mounted on a substrate 102 (e.g., leadframe 102). Wire bonds 106 provide electrical interconnection between (1) die pads 104a of semiconductor die 104 and (2) leads 102a of leadframe 102. Respective ones of wire bonds 106 include first bond 106a that is bonded to a respective die pad 104a, and second bond 106b that is bonded to a respective lead 102a. First bond 106a is formed using a conventional ball bonding technique, that is, a free air ball is formed on an end of a length of wire, and the free air ball is deposited and bonded to the bonding location (e.g., die pad 104a) to form a first bond of a wire loop (e.g., first bond 106a of wire loop 106).

Figure 2A:
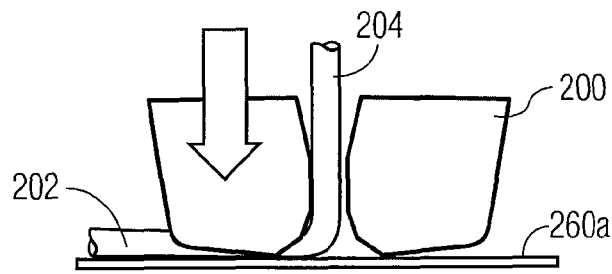
FIGS. 2A-2I are block diagram views illustrating a method of forming a wire loop in accordance with an exemplary embodiment of the present invention.
Figure 2B:
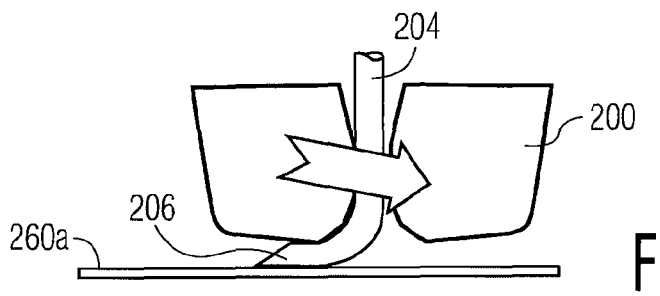
Figure 2C:
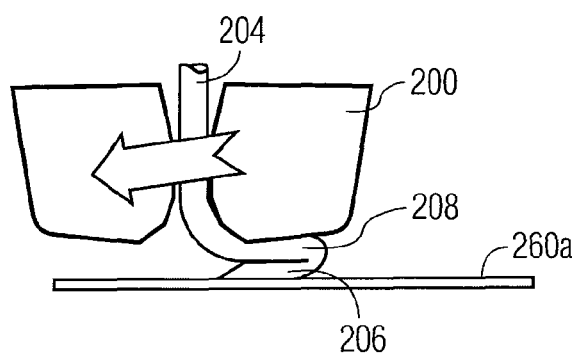
Figure 2D:
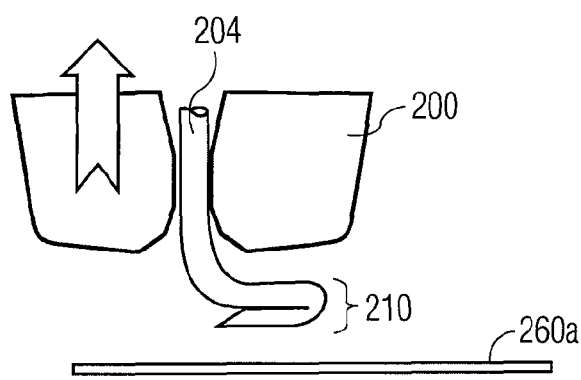
Figure 2E:
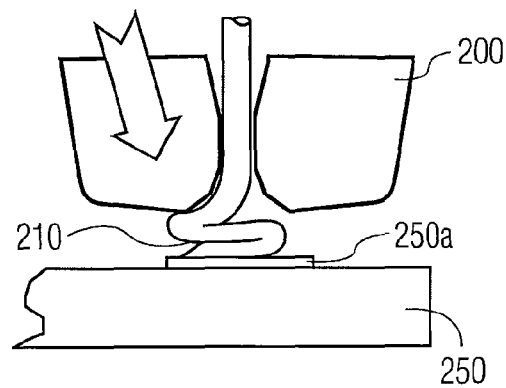
Figure 2F:
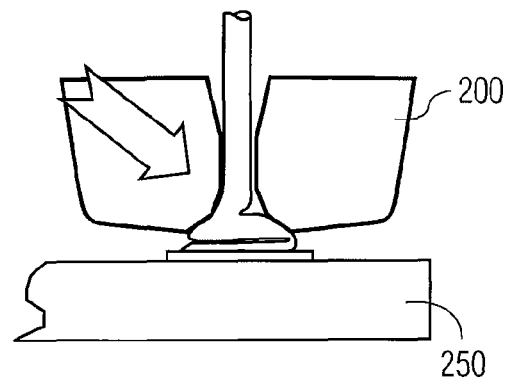
Figure 2G:
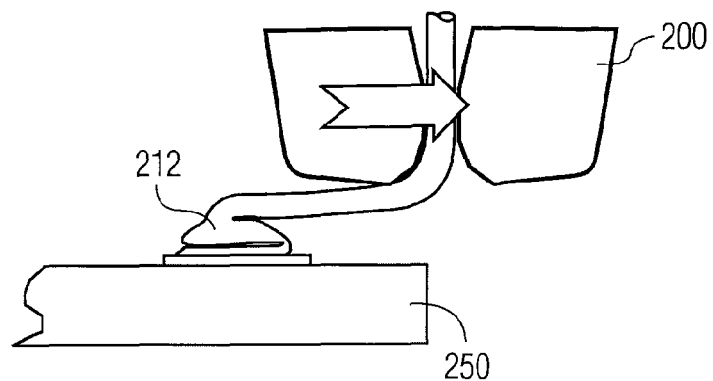
Figure 2H:
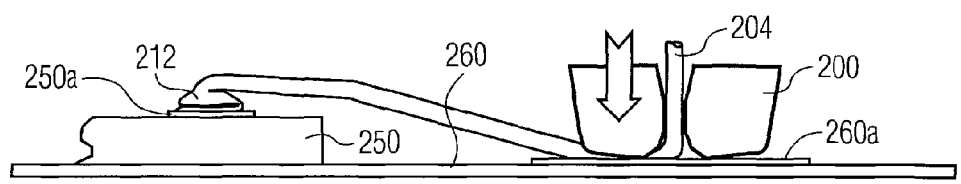
Figure 2I:
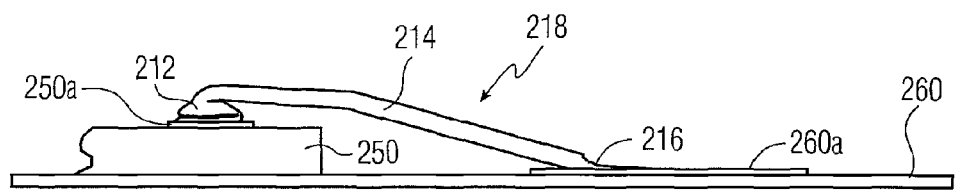

FIGS. 2A-2I are block diagram views illustrating a method of forming a wire loop in accordance with an exemplary embodiment of the present invention. FIG. 2A illustrates a lower portion of capillary bonding tool 200 terminating second bond 202 (e.g., stitch bond 202) of a completed wire loop (the remainder of the wire loop is not shown, only second bond 202) on lead 260a of a leadframe 260 (an exemplary leadframe 260 is illustrated in FIGS. 2H-2I, but is not shown in FIG. 2A). Wire 204 is engaged in an aperture which extends the length of capillary bonding tool 200, and wire 204 is used to form wire loops. After severing wire supply 204 from second bond 202 of the previously formed wire loop, capillary bonding tool 200 undergoes motions (e.g., an upward motion, followed by the motion to the right and downward shown in FIG. 2B) to lay a first portion of wire 206 on lead 260a (adjacent second bond 202 has been removed from FIG. 2B for simplicity). Then, in FIG. 2C, capillary bonding tool 200 undergoes motions to lay a second portion of wire 208 on top of first portion of wire 206. By laying portion 208 on top of portion 206 (and by applying any desired force, energy, etc.), a fold of wire 210 is formed. In FIG. 2D, bonding tool 200 is raised above the surface of lead 260a, whereby fold of wire 210 is removed from lead 260a.

In FIG. 2E, fold of wire 210, moved away from lead 260a, is deposited on a first bonding location. In the example illustrated, the first bonding location is die pad 250a of semiconductor die 250. In FIG. 2F, fold of wire 210 is bonded to die pad 250a to create first bond 212 shown in FIG. 2G. Fold of wire 210 may be bonded to die pad 250a using conventional techniques such as the application of ultrasonic energy, thermosonic energy, thermocompressive energy, etc. In connection with the motions shown in FIGS. 2G-2H a length of wire 214 (labelled in FIG. 2I) is extended between the first bonding location (i.e., die pad 250a) and a second bonding location (in the example illustrated, second bonding location is another lead 260a of leadframe 260). In FIG. 2H, a second bond (e.g., a stitch bond) is formed on another lead 260a, and in FIG. 2I, the wire has been severed such that wire 204 engaged in capillary bonding tool 200 is separated from the now formed wire loop 218. As shown in FIG. 2I, wire loop 218 extends between die pad 250a and another lead 260a. Wire loop 218 includes first bond 212, length of wire 214, and second bond 216. Capillary bonding tool 200 (engaged with wire 204 now separated from wire loop 218) may have undergone the same motions shown in FIGS. 2A-2D to form a fold of wire on another lead 260a shown in FIGS. 2H-2I to prepare for the next first bond of the next wire loop; however, this operation is not shown in FIGS. 2H-2I for simplicty.

In the exemplary embodiment of the present invention illustrated in FIGS. 2A-2I, a single fold of wire (e.g., fold of wire 210) was used to form the first bond in lieu of a free air ball as in conventional ball bonding. More specifically, fold of wire 210 was directly deposited on the first bonding location (e.g., die pad 250a shown in FIG. 2E without any intervening free air ball between fold of wire 210 and die pad 250a). However, in connection with the present invention, it is understood that no fold of wire may have been used, that is, wire portion 206 (shown in FIG. 2B) may have been used to form the first bond on die pad 250a without second wire portion 208 folded on top of wire portion 506.

Figure 2J:
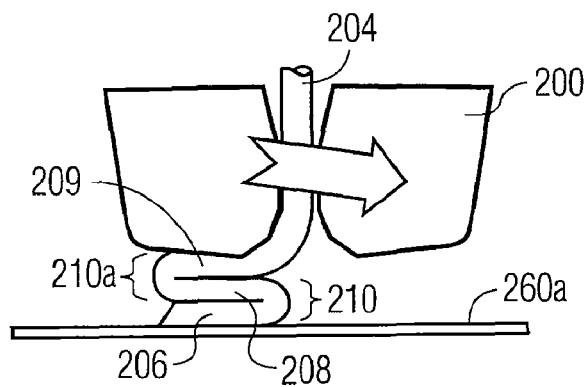
FIGS. 2J-2L are block diagram views illustrating alternative steps for a portion of the method of forming a wire loop in FIGS. 2A-2I, in accordance with another exemplary embodiment of the present invention.
Figure 2K:
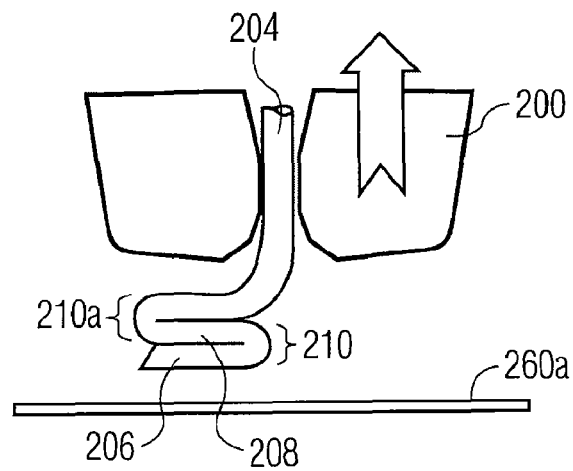
Figure 2L:
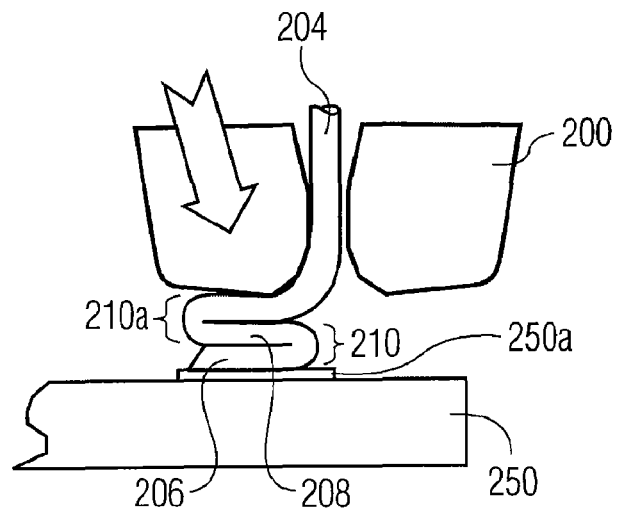

Further, it is understood that in connection with the various exemplary embodiments of the present invention disclosed herein, more than one fold of wire may be formed and used to form the first bond (or the second bond). Referring now to FIGS. 2J-2L, these figures would take the place of FIGS. 2D-2E in the sequence of diagrams. That is, in another exemplary embodiment of the present invention, FIGS. 2A-2C, FIGS. 2J-2L, and FIGS. 2F-2I may be combined. More specifically, FIG. 2J illustrates third portion of wire 209 which is laid across second portion of wire 208 (any desired force, energy, etc. may also be applied when laying third portion of wire 209 across second portion of wire 208). Thus, instead of forming a single fold of wire (i.e., fold of wire 210) two folds of wire are provided (i.e., fold of wire 210, and fold of wire 210a). Of course, additional folds of wire may be formed as well (e.g., three folds of wire, four folds of wire, and more). In FIG. 2K the formed "ball" including folds of wire 210, 210a is raised above lead 260a (similar to the motion previously described in FIG. 2D). In FIG. 2L, the "ball" including folds of wire 210, 210a is deposited on die pad 250a (similar to the motion previously described in FIG. 2E). The subsequent steps (e.g., forming the first bond, extending a length of wire to the second bonding location, forming the second bond, and severing the wire to separate the wire supply engaged with the capillary from the now formed wire loop) may proceed as described above in connection with FIGS. 2F-2I.

There are various reasons why multiple folds of wire may be desired in the "ball." For example, additional material may allow for better bonding without damaging sensitive regions of the semiconductor die. Further, in an effort to overcome directional issues in forming the wire loops, additional folds of wire may be added to the "ball." Further still, the additional fold(s) may assist in reducing the potential for undesirable wire rotation. Of course, additional reasons are contemplated.

Thus, in the example described above with respect to FIGS. 2A-2I (and in the example described above with respect to FIGS. 2A-2C, FIGS. 2J-2L, and FIGS. 2F-2I), the fold(s) of wire are formed immediately following a second bond operation on a lead of a leadframe. Then the "ball" including the fold(s) of wire is raised (i.e., raised above the second bond location of the previously formed wire loop) and moved to the first bonding location of the next wire loop. However, this is simply an exemplary (nonlimiting) sequence. FIGS. 3A-3J illustrate another exemplary method of forming a wire loop with an alternative sequence. Instead of forming the "ball" including the fold(s) of wire on a second bonding location of a previously formed wire loop as in FIGS. 2A-2I, the "ball" in FIGS. 3A-3J is formed on the first bonding location at the time of forming the wire loop: that is, the "ball" is not formed at a forming location and then moved to the first bonding location.

Figure 3A:
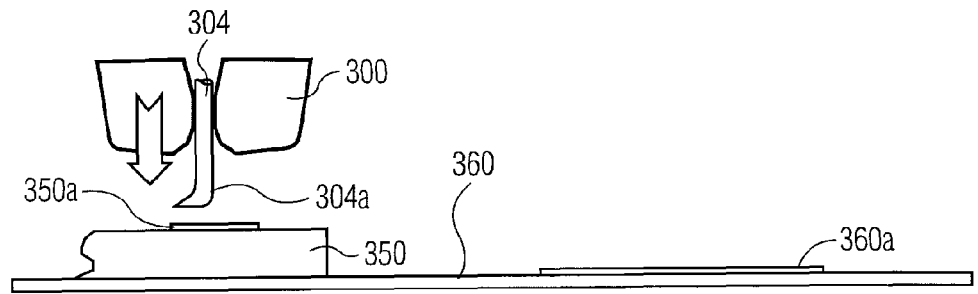
FIGS. 3A-3J are block diagram views illustrating a method of forming a wire loop in accordance with another exemplary embodiment of the present invention.
Figure 3B:
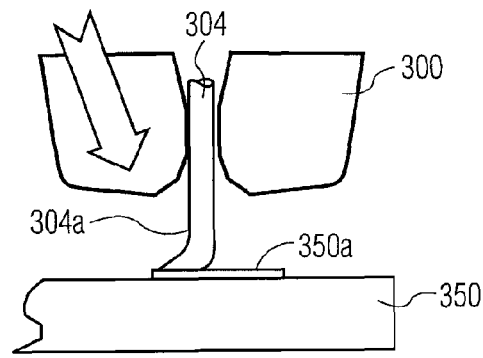
Figure 3C:
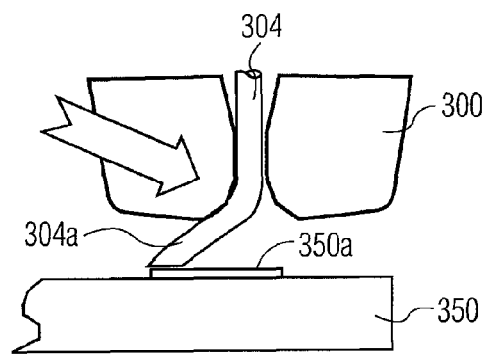
Figure 3D:
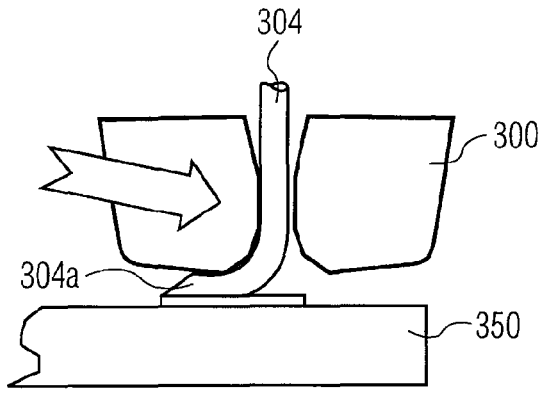
Figure 3E:
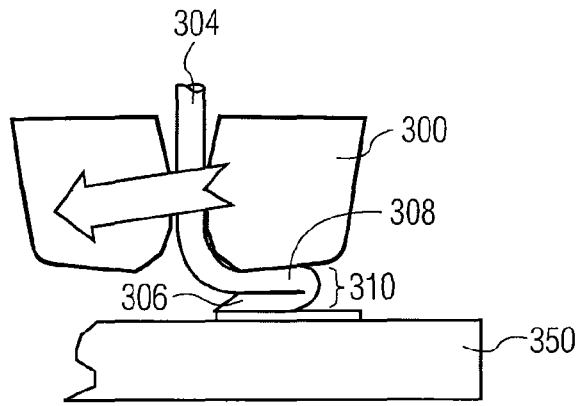
Figure 3F:
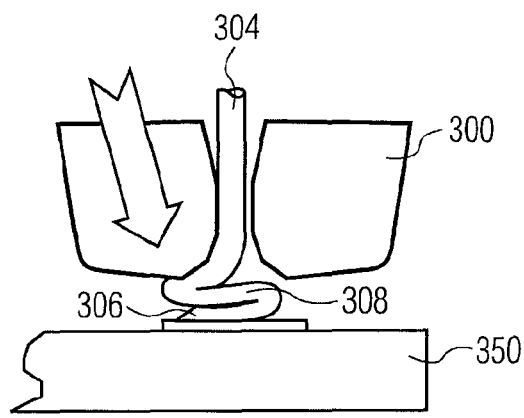
Figure 3G:
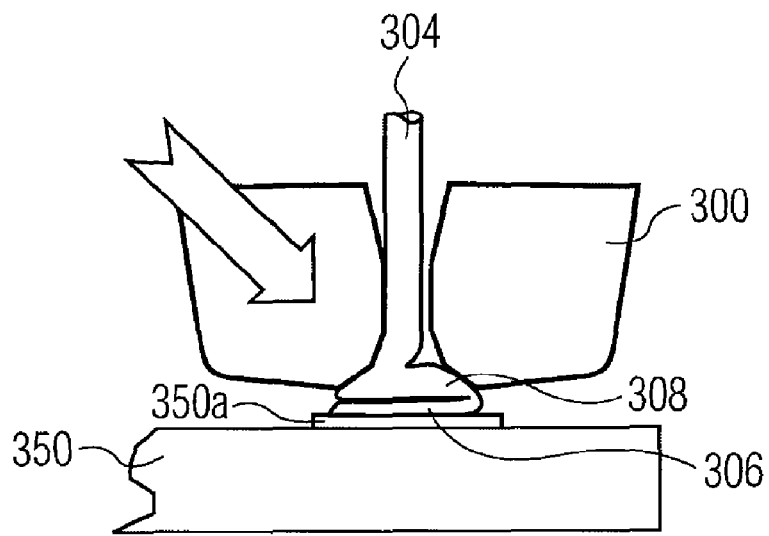
Figure 3H:
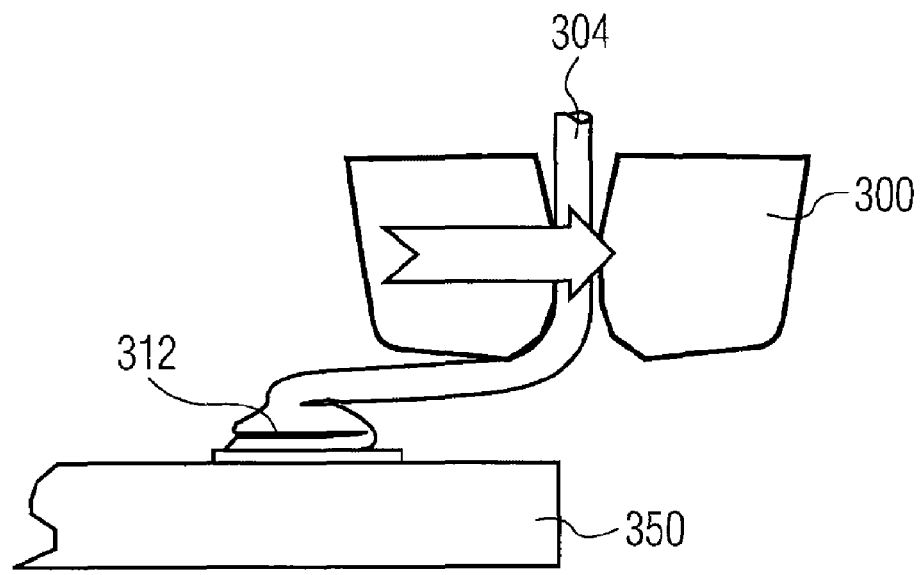
Figure 3I:
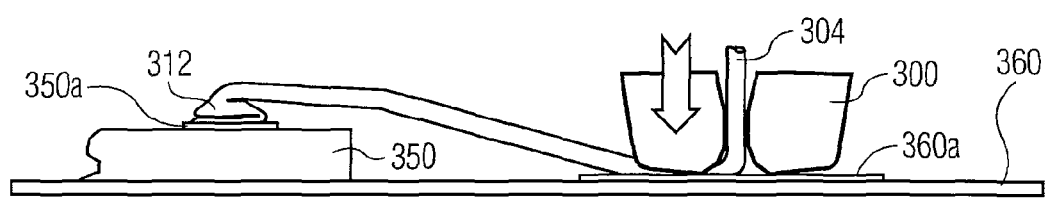
Figure 3J:
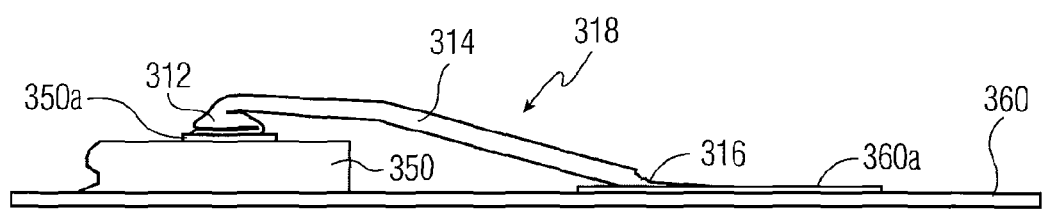

Referring now to FIG. 3A, wire tail 304a of wire supply 304 hangs below bonding tool 300 above first bonding location 350a (in this example, the first bonding location is die pad 350a of semiconductor die 350). Wire tail 304a is then lowered toward, and laid across, die pad 350a in FIGS. 3B-3D. After wire tail 304a is laid across die pad 350a, it is called first portion of wire 306 (analogous to first portion of wire 206 in FIG. 2B). In FIG. 3E, second portion of wire 308 is laid across first portion of wire 306. First portion of wire 306, with second portion of wire 308 laid across, is referred to as fold of wire 310. In FIGS. 3F-3G, fold of wire 310 is bonded to die pad 350a to create first bond 312 shown in FIG. 3H. In connection with the motions shown in FIGS. 3H-3I a length of wire 314 (labelled in FIG. 3J) is extended between the first bonding location (i.e., die pad 350a) and a second bonding location (in the example illustrated, second bonding location is another lead 360a of leadframe 360). In FIG. 3I, a second bond (e.g., a stitch bond) is formed on another lead 360a, and in FIG. 3J, the wire has been severed such that wire 304 engaged in capillary bonding tool 300 is separated from the now formed wire loop 318. As shown in FIG. 3J, wire loop 318 extends between die pad 350a and lead 360a. Wire loop 318 includes first bond 312, length of wire 314, and second bond 316.

Figure 4A:
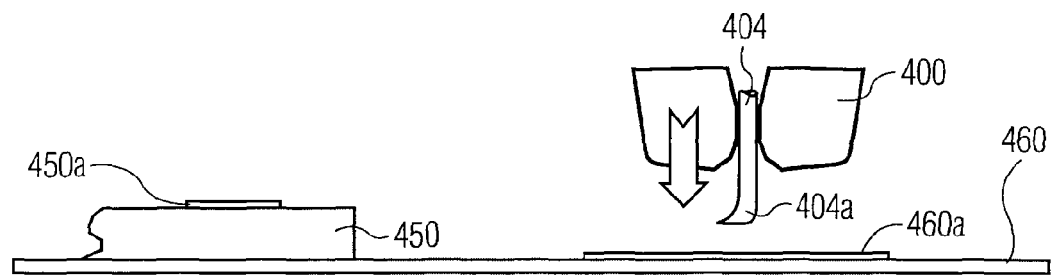
FIGS. 4A-4J are block diagram views illustrating a method of forming a wire loop in accordance with yet another exemplary embodiment of the present invention.
Figure 4B:
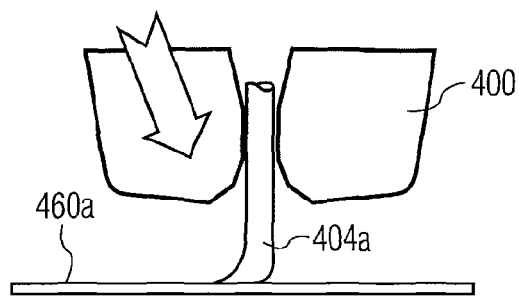
Figure 4C:
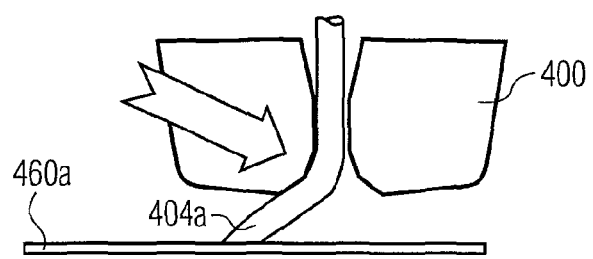
Figure 4D:
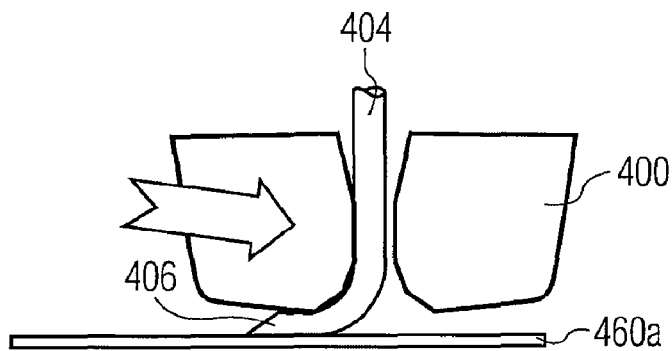
Figure 4E:
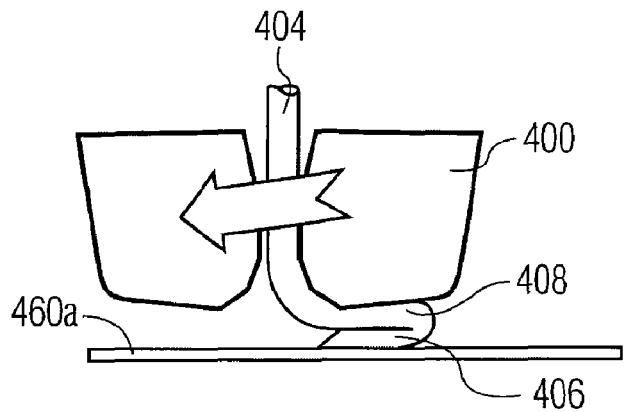
Figure 4F:
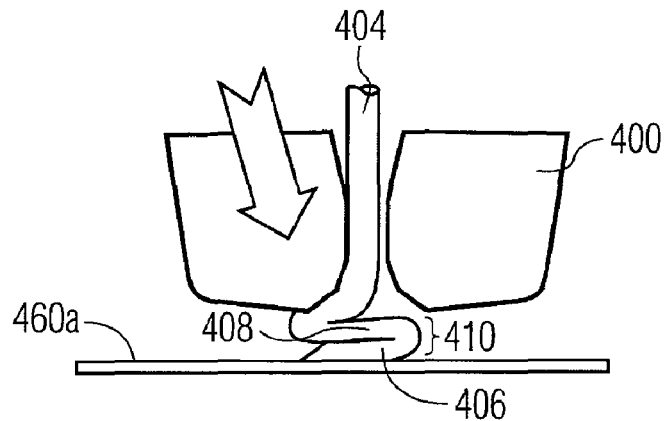
Figure 4G:
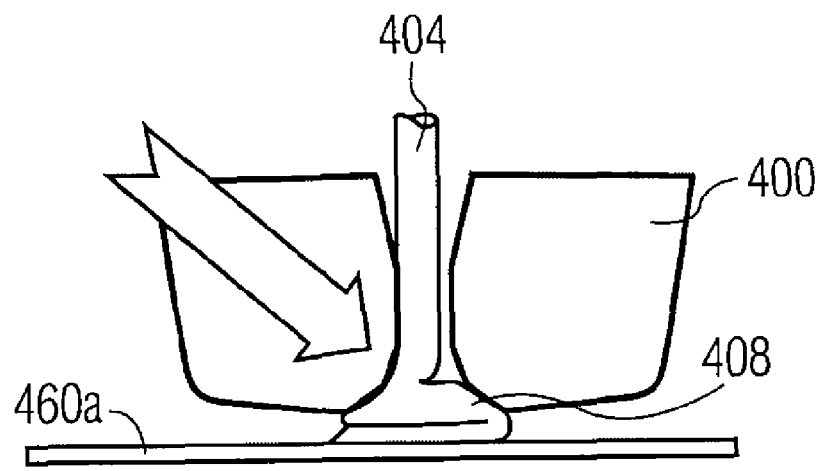
Figure 4H:
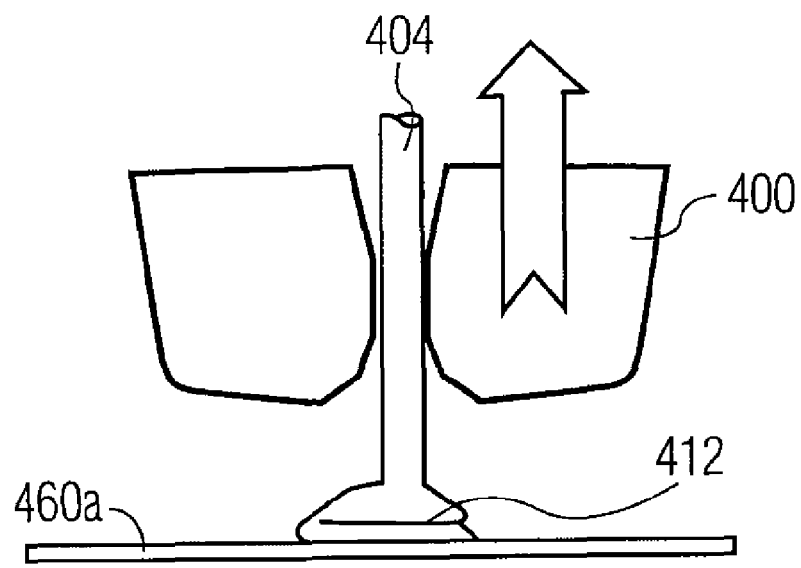
Figure 4I:
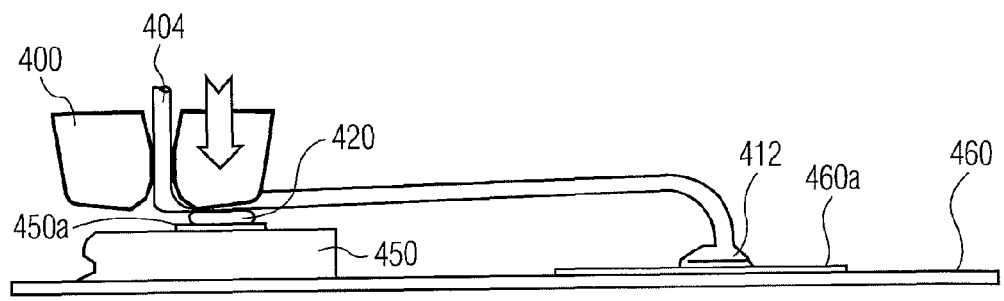
Figure 4J:
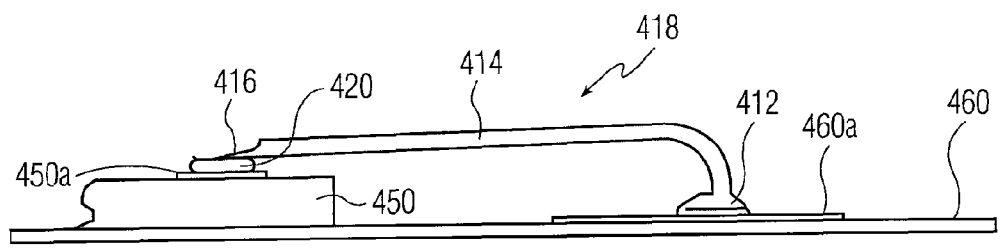

FIGS. 4A-4J illustrate yet another exemplary embodiment of the present invention. As opposed to forming the "ball" including the fold(s) of wire at a location and then moving the formed "ball" to a first bonding location (as in FIGS. 2A-2I), the example shown in FIGS. 4A-4J is similar to the example shown in FIGS. 3A-3J in that the "ball" is formed on the first bonding location at the time of forming the wire loop. However, FIGS. 4A-4J differ from FIGS. 3A-3J, for example, because in FIGS. 4A-4J the "ball" is formed on a bonding location of a substrate (e.g., a lead of a leadframe) as opposed to a die pad of a semiconductor die. This process (e.g., forming a first bond on a leadframe/substrate instead of on a die pad of a semiconductor die) is sometimes referred to as "reverse bonding." Referring now to FIG. 4A, wire tail 404a of wire supply 404 hangs below bonding tool 400 above first bonding location 460a (in this example, the first bonding location is lead 460a of leadframe 460). Wire tail 404a is then lowered toward, and laid across, lead 460a in FIGS. 4B-4D. After wire tail 404a is laid across lead 460a, it is called first portion of wire 406 (analogous to first portion of wire 206 in FIG. 2B). In FIG. 4E, second portion of wire 408 is laid across first portion of wire 406. First portion of wire 406, with second portion of wire 408 laid across, is referred to as fold of wire 410. In FIGS. 4F-4G, fold of wire 410 is bonded to lead 460a to create first bond 412 shown in FIG. 4H. In connection with the motions shown in FIGS. 4H-4I a length of wire 414 (labelled in FIG. 4J) is extended between the first bonding location (i.e., lead 460a) and a second bonding location (in the example illustrated, second bonding location is die pad 450a of semiconductor die 450). In FIG. 4I, a second bond (e.g., a stitch bond) is formed on conductive bump 420 which has previously been formed on die pad 450a. As is known to those skilled in the art, conductive bumps may be formed using a number of techniques including "bumping" or "stud bumping" using a wire bonding machine. Thus, prior to forming the wire loop, bump 420 was formed. Conductive bumps may be used, for example, to provide increased material to avoid damage to a semiconductor die when forming a stitch bond thereon. Another exemplary use of such a conductive bump may be to increase the height of the second bonding location as is desired in the given application. Referring now to FIG. 4J, the wire has been severed such that wire 404 engaged in capillary bonding tool 400 is separated from the now formed wire loop 418. As shown in FIG. 4J, wire loop 418 extends between lead 460a and conductive bump 420 (on die pad 450a). Wire loop 418 includes first bond 412, length of wire 414, and second bond 416. Of course, second bond 416 may be directly bonded to die pad 450a, without intervening conductive bump 420.

Figure 5:
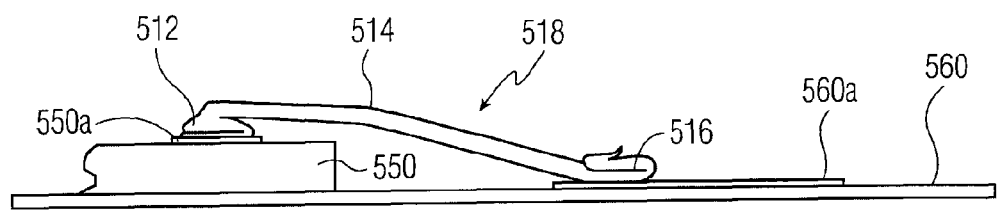
FIG. 5 is a side view of a wire loop in accordance with an exemplary embodiment of the present invention.

FIG. 5 is a side view of wire loop 518 formed in accordance with another exemplary embodiment of the present invention. The various steps used to form wire loop 518 are not shown in specificity. The critical teaching of FIG. 5 is that wire loop 518 is formed by forming folds of wire at each of the first bond and the second bond. Wire loop 518 includes first bond 512 (on die pad 550a of semiconductor die 550), length of wire 514, and second bond 516 (on lead 560a of leadframe 560). First bond 512 was formed in a manner substantially similar to first bond 212 of wire loop 218 shown in FIG. 2I. Second bond 516 was also formed using a technique of laying portions of wire on top of one another and forming a fold of wire. While FIG. 5 shows the first bond on die pad 550a and the second bond on lead 560a, this is an example, and of course, the order could be reversed such that first bond 512 was formed on lead 560a and second bond 516 was formed on die pad 550a.

Figure 6A:
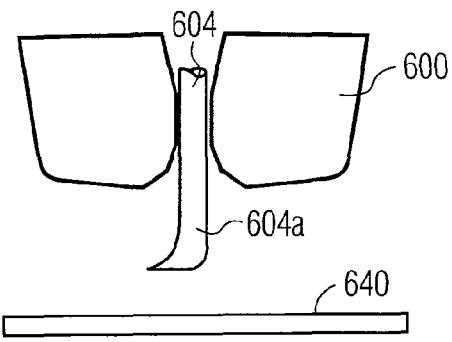
FIGS. 6A-6J are block diagram views illustrating a method of forming a wire loop in accordance with yet another exemplary embodiment of the present invention.
Figure 6B:
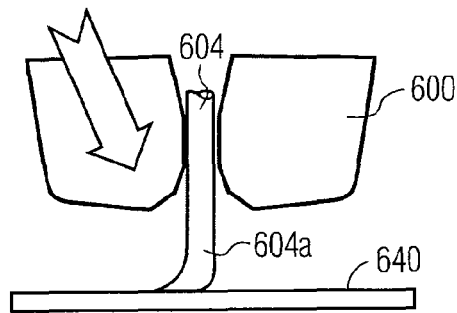
Figure 6C:
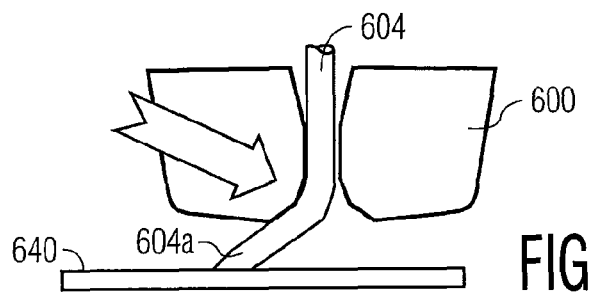
Figure 6D:
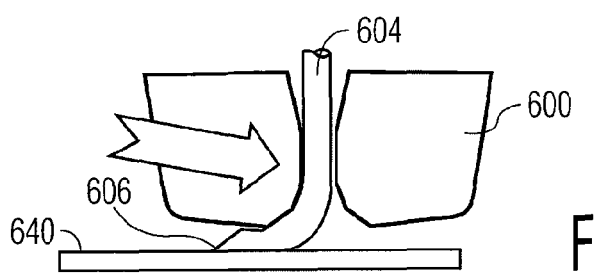
Figure 6E:
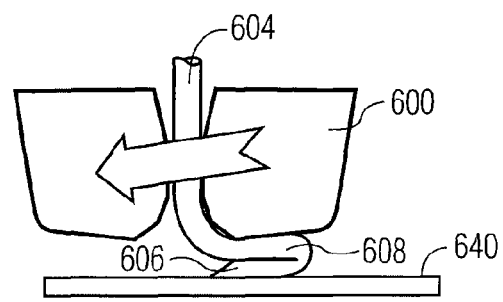
Figure 6F:
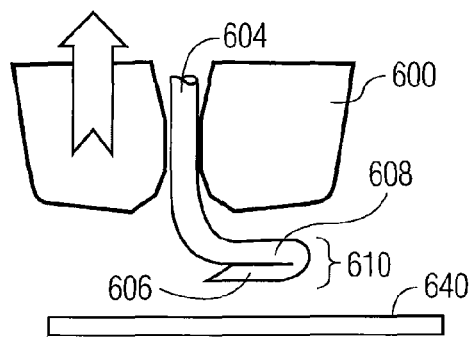
Figure 6G:
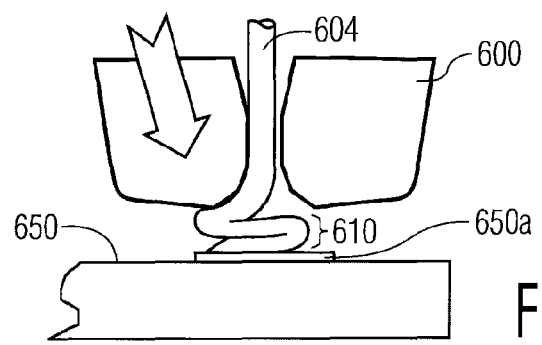
Figure 6H:
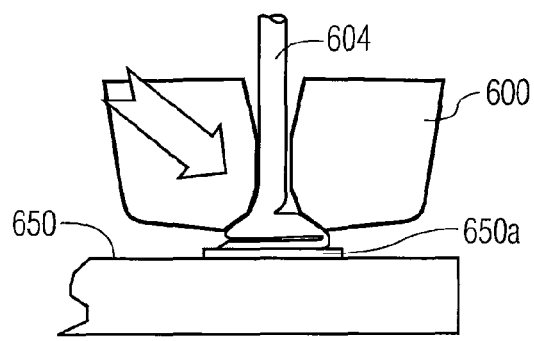
Figure 6I:
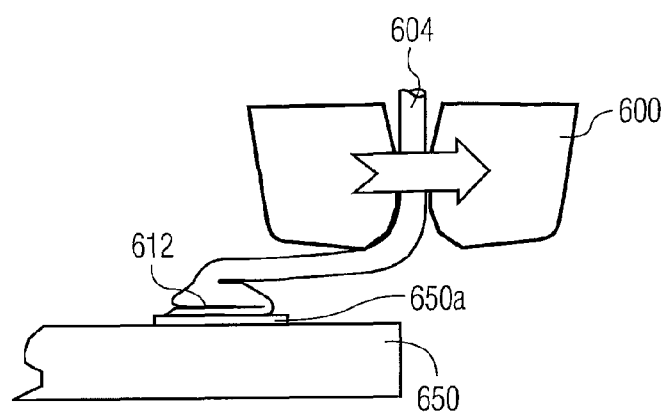
Figure 6J:
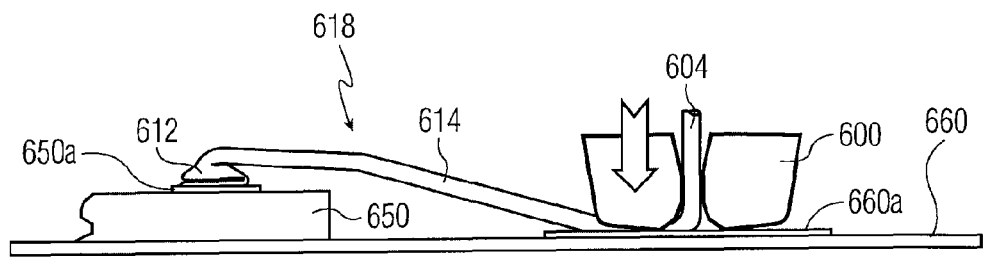

FIGS. 6A-6J illustrate another process for forming a wire loop in accordance with yet another exemplary embodiment of the present invention. In fact, the process of forming the wire loop in FIGS. 6A-6J is very similar to the process shown FIGS. 2A-2I. That is, both processes (i.e., the process shown in FIGS. 2A-2I and the process shown in FIGS. 6A-6J) illustrate forming a "ball" including a fold(s) of wire on a first surface, and then moving the formed "ball" to a first bonding location. FIGS. 2A-2I illustrate forming the "ball" at the second bond location immediately after forming a stitch bond of a previously formed wire loop. In contrast, FIGS. 6A-6J illustrate forming the "ball" at a forming location that is different from the second bonding location of the previously formed wire loop. The forming location may be any surface (e.g., part of the device being bonded or an adjacent surface) that will receive the portions of wire used to form the fold(s) of wire, and that allows for the removal of the "ball" (including the fold(s) of wire) to be moved to the first bonding location. For example, the forming location may be another lead of a leadframe, a surface of the substrate/leadframe, a die pad, a surface of the semiconductor die, a silver plated surface that provides for temporary adhesion and subsequent removal, etc. Referring now to FIG. 6A, wire tail 604a of wire supply 604 hangs below bonding tool 600 above forming location 640. Wire tail 604a is then lowered toward, and laid across, forming location 640 in FIGS. 6B-6D. After wire tail 604a is laid across forming location 640, it is called first portion of wire 606 (analogous to first portion of wire 206 in FIG. 2B). In FIG. 6E, second portion of wire 608 is laid across first portion of wire 606 (any desired force and/or energy may be applied to secure second portion 608 to first portion 606). First portion of wire 606, with second portion of wire 608 laid across, is referred to as fold of wire 610. In FIG. 6F, fold of wire 610 is raised above forming location 640, an in FIGS. 6G-6H, fold of wire 610 is moved toward and bonded to die pad 650a of semiconductor die 650 to create first bond 612 shown in FIG. 6I. In connection with the motions shown in FIGS. 6I-6J a length of wire 614 is extended between the first bonding location (i.e., die pad 650a) and a second bonding location (in the example illustrated, second bonding location is lead 660a of leadframe 660). In FIG. 6J, a second bond (e.g., a stitch bond) is formed on lead 660a, and subsequently (not shown) the wire will be severed such that wire 604 engaged in capillary bonding tool 600 will be separated from wire loop 618. As shown in FIG. 6J, wire loop 618 extends between die pad 650a and lead 660a. Wire loop 618 includes first bond 612, length of wire 614, and the second bond formed on lead 660a (not labelled in FIG. 6J).

Figure 7B:
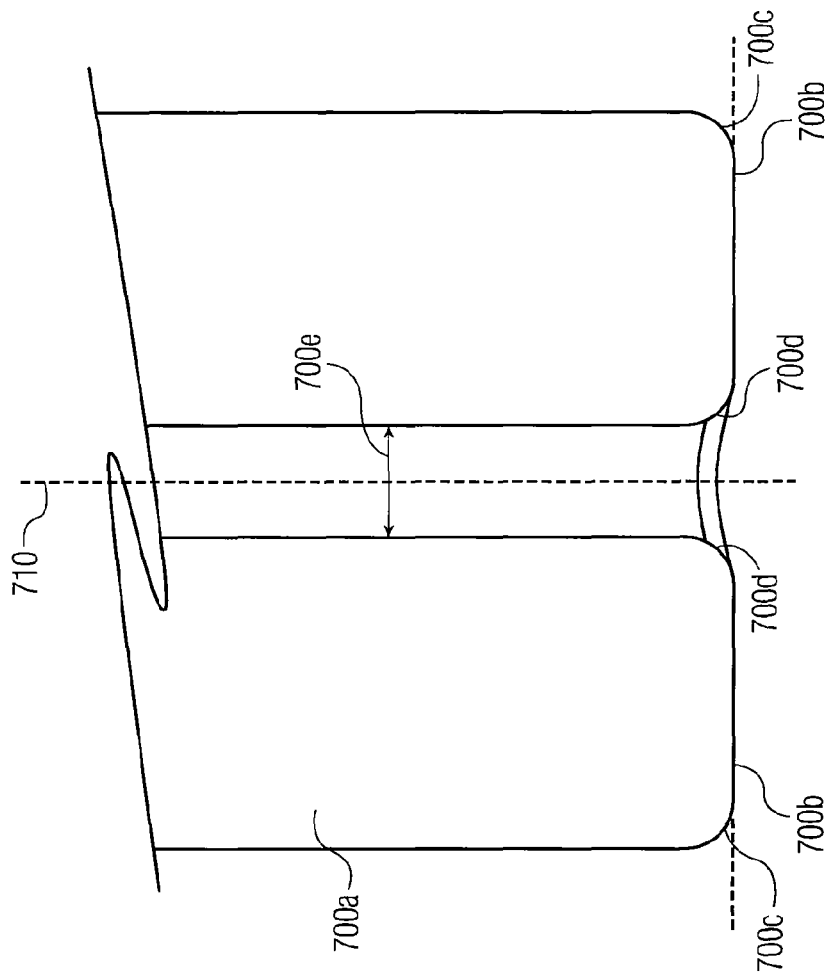
FIG. 7B is a detailed view of a portion of FIG. 7A.
Figure 7A:
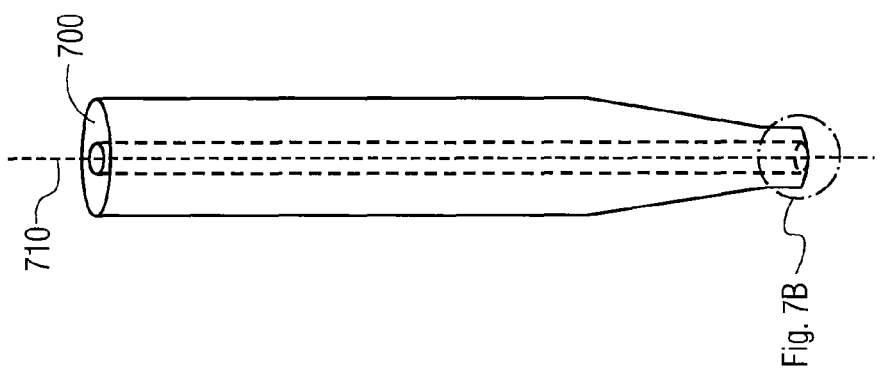
FIG. 7A is a perspective view of a bonding tool in accordance with an exemplary embodiment of the present invention.

Wire loops may be formed according to the present invention using many different types of bonding tools having different shapes, tip configurations, etc. Many conventional bonding tools are well suited for forming the inventive wire loops. FIGS. 7A-7B and FIGS. 9A-9B illustrate exemplary inventive tools that may also be useful in forming wire loops according to the present invention. FIG. 7A is a perspective view of capillary bonding tool 700 which defines an aperture (having a internal diameter 700e shown in FIG. 7B) along its length configured to receive bonding wire as in conventional ball bonding capillary tools. FIG. 7B is a detailed view of tip end portion 700a of capillary bonding tool 700 of FIG. 7A. The face end portion 700b of capillary bonding tool 700 has a face angle of substantially zero degrees. That is, the face end portion 700b of capillary bonding tool 700 is substantially parallel to a bonding surface (e.g., the semiconductor die surface, etc.), and substantially perpendicular to the length wise axis 710 of capillary bonding tool 700. This is in contrast to conventional capillary bonding tools which have a face angle of, for example, approximately 8-15 degrees.

At the end of tip end portion 700a is also shown outer radius 700c and inner radius 700d. In the illustrated example in FIG. 7B, both outer radius 700c and inner radius 700d have the same shape/curvature. This may be desirable, for example, because it tends to allow the shape of the resultant bonds (e.g., first bonds, second bonds) to have the same shape regardless of the direction in which they are formed. This is in contrast to a conventional capillary bonding tool which may have an outer radius having a first shape, and an inner radius having a different (e.g., chamfered) shape. Of course, the illustrated shape of outer radius 700c and inner radius 700 are exemplary in nature. Alternative shapes (e.g., alternative shapes that are the same inner versus outer, alternative shapes that are different inner versus outer) are contemplated.

Figure 8A:
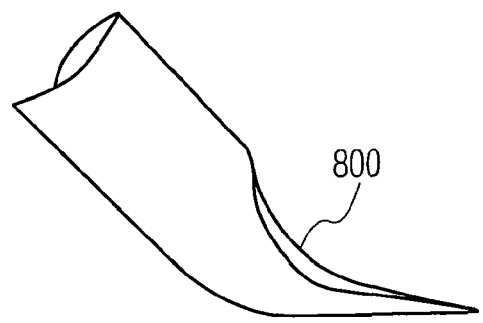
FIGS. 8A-8B are side and top views, respectively, of second bonds formed using a conventional bonding tool.
Figure 8B:
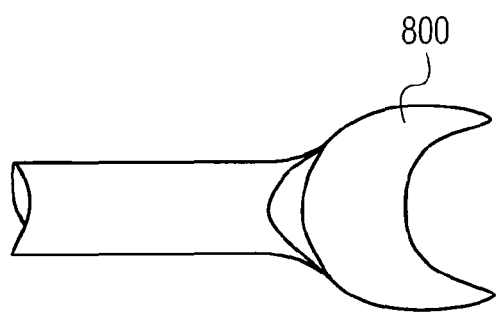
Figure 9A:
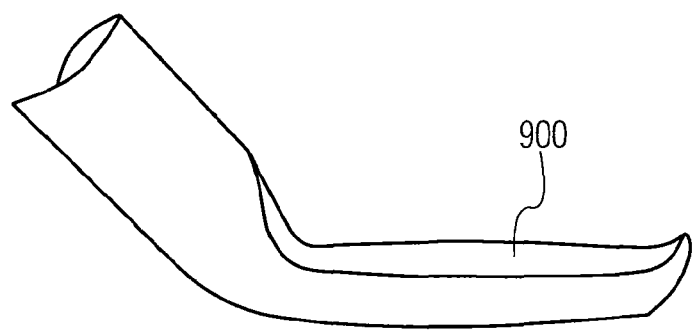
FIGS. 9A-9B are side and top views, respectively, of second bonds formed using a bonding tool in accordance with an exemplary embodiment of the present invention.
Figure 9B:
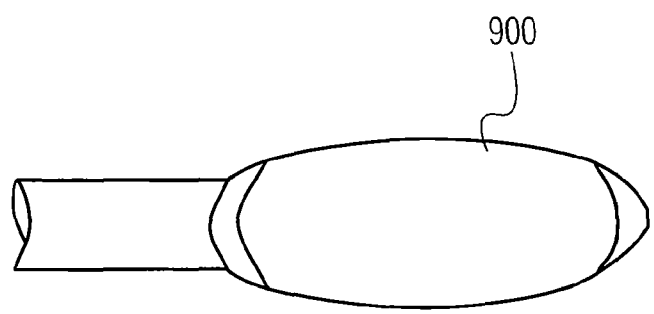

FIGS. 8A-8B are side and top views, respectively, of second bond 800 formed using a conventional bonding tool. In contrast, FIGS. 9A-9B are side and top views, respectively, of second bond 900 formed using bonding tool 700. As is clear from FIGS. 8A-8B and FIGS. 9A-9B, second bond 900 is longer than second bond 800, and provides for a stronger second bond. Face end portion 700b, having a face angle of substantially zero degrees, allows for more of the wire to become bonded which reduces the potential for a short-tail errors, non-stick errors, and/or other bonding problems.

Figure 10A:
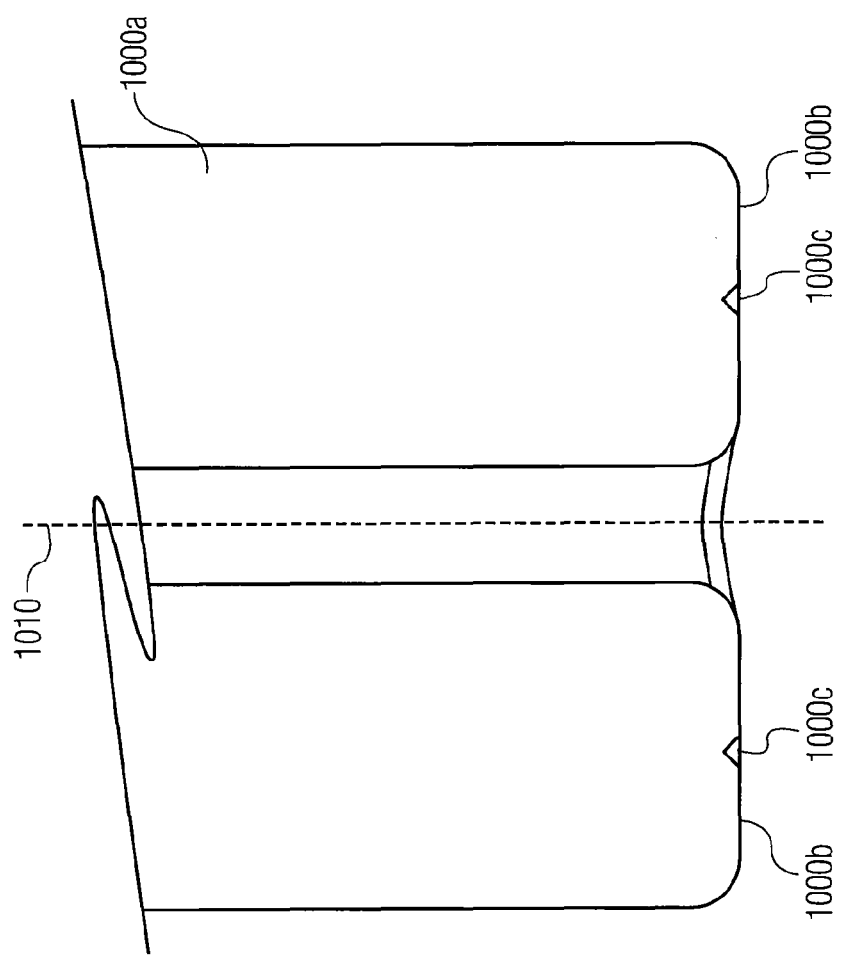
FIG. 10A is a detailed view of a portion of a bonding tool in accordance with another exemplary embodiment of the present invention.
Figure 10B:
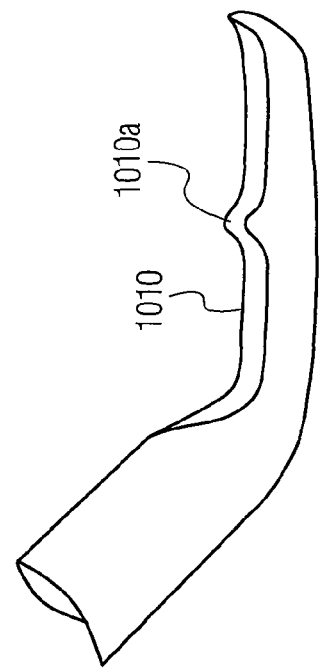
FIG. 10B is a side view of a second bond formed using the bonding tool of FIG. 10A.

FIG. 10A is a perspective view of tip end portion 1000a of a bonding tool in accordance with another exemplary embodiment of the present invention. Tip end portion 1000a is similar to tip end portion 700a of capillary bonding tool 700 (and the remainder of the tool is similar to capillary bonding tool 700), and tip end, portion 1000a terminates at face end portion 1000b. As with face end portion 700b in FIG. 7B, face end portion 1000b has a face angle of substantially zero degrees. Face end portion 1000b defines depressions 1000c. FIG. 10B is a side view of second bond 1010 formed using a bonding tool having a tip end portion as shown in FIG. 10A. Second bond 1010 includes bump 1010a. Bump 1010a is provided on second bond 1010 because of depression 1000c. By defining depression 1000c in face end portion 1000b, additional wire material may be gripped by the bonding tool, allowing for better gripping of the wire when forming the fold(s) of wire and the remainder of the wire loop (and reducing the potential for wire slip when forming the fold(s) of wire and the remainder of the wire loop).

Figure 11:
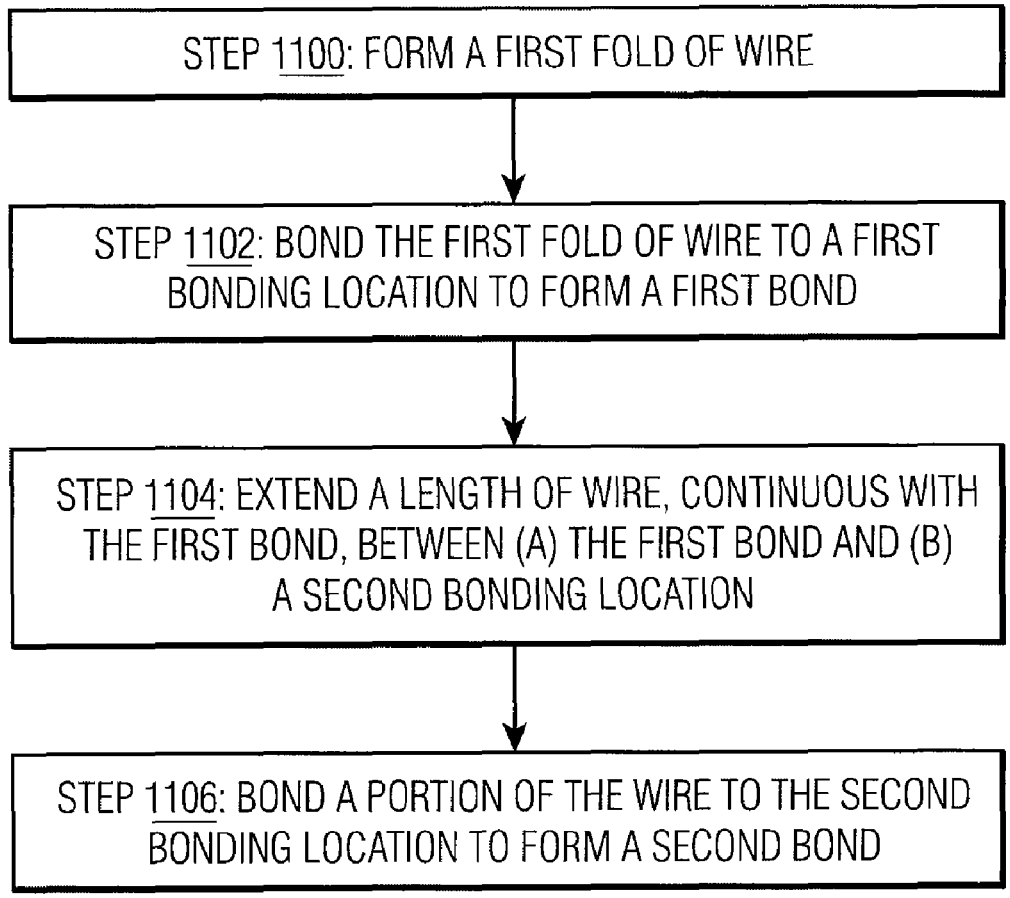
FIG. 11 is a flow diagram illustrating a method of forming a wire loop in accordance with an exemplary embodiment of the present invention.

FIG. 11 is a flow diagram in accordance with certain exemplary embodiments of the present invention. As is understood by those skilled in the art, certain steps included in the flow diagram may be omitted; certain additional steps may be added; and the order of the steps may be altered from the order illustrated.

FIG. 11 is a flow diagram illustrating a method of forming a wire loop in accordance with an exemplary embodiment of the present invention. At step 1100, a first fold of wire is formed. For example, the fold of wire may be formed at a second bond location of a previously formed second bond of a just completed wire loop, and then the fold of wire may be moved from the second bond location of the previously formed wire loop towards the first bonding location (as in the exemplary embodiment illustrated in FIGS. 2A-2I). In another example, the first fold of wire may be formed at a first bonding location (as in the exemplary embodiments illustrated in FIGS. 3A-3J and in FIGS. 4A-4J). In yet another example, the fold of wire may be formed at a forming location (e.g., a forming location other than the second bond location of a previously formed wire loop), and then the fold of wire is moved from the forming location towards the first bonding location (as in the exemplary embodiment illustrated in FIGS. 6A-6J). Of course, other variations are contemplated. At step 1102, the first fold of wire is bonded to the first bonding location to form a first bond. At step 1104, a length of wire is extended, continuous with the first bond, between (a) the first bond and (b) a second bonding location. At step 1106, a portion of the wire is bonded to the second bonding location to form a second bond.

Thus, according to the various exemplary embodiments of the present invention, techniques have been disclosed for forming wire loops by providing a "ball" including at least one fold of wire in lieu of forming a free air ball. Thus, in certain applications, the EFO assembly used to form free air balls may be omitted from a wire bonding machine, thereby saving costs and the complexities inherent in free air ball formation and use (e.g., a heat affected zone in the wire potentially resulting in undesirable wire leaning, wire necking, wire breaks, wire sag, wire sway, etc). Of course, it is not necessary that the EFO assembly be omitted, as the present invention may be used in connection with a machine that uses free air balls for certain applications (or for portions of a looping process) and then uses the inventive techniques for other applications (or for other portions of the looping process).

The present invention may also result in additional benefits such as, for example, reduced height of wire loops, reduced pitch of wire loops, flexible loop shape, increased mean time between assists on a wire bonding machine, etc.

Various of the drawings include arrows which illustrate exemplary motion of a bonding tool. For example, FIG. 2A includes an arrow pointing downward signifying downward movement of bonding tool 200; however, it is understood that these arrows are provided as a guide only and are exemplary in nature. Additional or different motions may be provided in the formation of wire loops according to the present invention as is known to those skilled in the art. Further, as is known to those skilled in the art, force and energy (e.g., ultrasonic energy, thermosonic energy, thermocompressive energy, etc.) may be provided during the looping process as is desired, for example, to secure (temporarily or permanently) a portion of a wire to a location, to form a fold of wire by securing a first portion of a wire to a second portion of a wire, etc.

In certain of the figures, only a tip end portion of a bonding tool and a short length of wire is shown. For example, FIG. 2A illustrates only a tip end portion of bonding tool 200, and a short length of wire 204. As will be appreciated by those skilled in the art, the wire (e.g., wire 204 shown in FIG. 2A) extends upward through the remainder of the bonding tool (not shown) to other elements of a wire bonding system (e.g., a wire clamp used in the formation of the wire loops, an air system, a wire spool, etc.). Further, as is understood by those skilled in the art, the wire clamp or the like (not shown) is opened and closed as is needed to pay out wire in the formation of the fold(s) of wire and the remainder of the wire loop.

Although the present invention has been described primarily with respect to wire loops formed between (1) a die pad of a semiconductor die and (2) a lead of a leadframe, it is not limited thereto. The teachings of the present invention may be applicable to any of a number of wire bonding applications including, for example, die to die bonding and any other wire bonding application.

The wire bonding techniques of the present invention may be implemented in a number of alternative mediums. For example, the techniques can be installed on an existing computer system/server as software (a computer system used in connection with, or integrated with, a wire bonding machine). Further, the techniques may operate from a computer readable carrier (e.g., solid state memory, optical disc, magnetic disc, radio frequency carrier medium, audio frequency carrier medium, etc.) that includes computer instructions (e.g., computer program instructions) related to the wire bonding techniques.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of forming a wire loop, the method comprising the steps of:
   (1) forming a first fold of wire at a forming location, the first fold of wire including (a) a first portion of wire and (b) a second portion of wire laid across the first portion of wire;
   (2) bonding the first fold of wire to a first bonding location to form a first bond, the first bonding location being different from the forming location;
   (3) extending a length of wire, continuous with the first bond, between (a) the first bond and (b) a second bonding location; and
   (4) bonding a portion of the wire to the second bonding location to form a second bond.

2. The method of claim 1 further comprising the step of moving the formed first fold of wire from (1) the forming location, to (2) the first bonding location prior to step (2).

3. The method of claim 1 further comprising the step of forming at least one additional fold of wire on the first fold of wire.

4. The method of claim 3 wherein the step of forming at least one additional fold of wire on the first fold of wire is accomplished prior to step (2), and wherein step (2) includes bonding the first fold of wire, and the at least one additional fold of wire, to the first bonding location to form the first bond.

5. The method of claim 1 wherein step (4) includes forming at least one fold of wire at the second bonding location, and then bonding the at least one fold of wire to the second bonding location to form the second bond.

6. The method of claim 1 wherein step (2) includes bonding the first fold of wire to the first bonding location to form the first bond, the first bonding location being a die pad of a semiconductor die.

7. The method of claim 1 wherein step (2) includes bonding the first fold of wire to the first bonding location to form the first bond, the first bonding location being a conductive region of a substrate.

8. The method of claim 7 wherein the conductive region of the substrate is a lead of a leadframe.

9. The method of claim 7 wherein step (4) includes bonding the portion of the wire to the second bonding location to form a second bond, the second bonding location being a die pad of a semiconductor die.

10. The method of claim 9 further comprising a step of forming a conductive bump, separate from the wire loop, on the die pad of the semiconductor die prior to step (4) such that step (4) includes bonding the portion of the wire to the conductive bump formed on the die pad to form the second bond.

11. The method of claim 1 wherein the wire loop is formed using a bonding tool, the bonding tool defining an aperture along a length of the bonding tool configured to receive a length of wire, the aperture terminating at a working tip of the bonding tool, wherein a face of the working tip defines at least one depression therein.

12. A non-transitory computer readable carrier including computer program instructions which cause a computer to implement a method of forming a wire loop, the method comprising the steps of:
   (1) forming a first fold of wire at a forming location, the first fold of wire including (a) a first portion of wire and (b) a second portion of wire laid across the first portion of wire;
   (2) bonding the first fold of wire to a first bonding location to form a first bond, the first bonding location being different from the forming location;
   (3) extending a length of wire, continuous with the first bond, between (a) the first bond and (b) a second bonding location; and
   (4) bonding a portion of the wire to the second bonding location to form a second bond.

* * * * *